US010707749B2

(12) United States Patent
Shin

(10) Patent No.: US 10,707,749 B2
(45) Date of Patent: Jul. 7, 2020

(54) CHARGE PUMP, AND HIGH VOLTAGE GENERATOR AND FLASH MEMORY DEVICE HAVING THE SAME

(71) Applicant: SAMSUNG ELECTRONICS CO., LTD., Suwon-si (KR)

(72) Inventor: Ho Young Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/414,972

(22) Filed: May 17, 2019

(65) Prior Publication Data

US 2020/0044564 A1 Feb. 6, 2020

(30) Foreign Application Priority Data

Jul. 31, 2018 (KR) .................. 10-2018-0088948
Dec. 21, 2018 (KR) .................. 10-2018-0167133

(51) Int. Cl.
*H02M 3/07* (2006.01)
*G11C 16/30* (2006.01)
*G11C 16/14* (2006.01)
*G11C 16/08* (2006.01)

(52) U.S. Cl.
CPC .............. *H02M 3/07* (2013.01); *G11C 16/30* (2013.01); *G11C 16/08* (2013.01); *G11C 16/14* (2013.01)

(58) Field of Classification Search
CPC .. H02M 3/07; H02M 3/073; H02M 2003/071; H02M 2003/072; H02M 2003/075; H02M 2003/076; H02M 2003/077; H02M 2003/078
See application file for complete search history.

(56) References Cited

U.S. PATENT DOCUMENTS

| 5,732,039 | A | * | 3/1998 | Javanifard | ............. | G11C 5/145 365/226 |
| 5,812,018 | A | * | 9/1998 | Sudo | .................... | H02M 3/073 327/537 |
| 5,831,844 | A | * | 11/1998 | Sudo | .................... | H02M 3/073 363/60 |
| 5,886,566 | A | * | 3/1999 | Park | ....................... | G11C 5/145 327/390 |
| 6,023,188 | A | | 2/2000 | Lee et al. | | |
| 6,094,095 | A | * | 7/2000 | Murray | ................ | H02M 3/073 327/530 |
| 6,175,264 | B1 | * | 1/2001 | Jinbo | .................... | G11C 5/145 327/534 |
| 6,184,741 | B1 | | 2/2001 | Ghilardelli et al. | | |

(Continued)

*Primary Examiner* — Thomas J. Hiltunen
(74) *Attorney, Agent, or Firm* — Sughrue Mion, PLLC

(57) ABSTRACT

A charge pump includes a first pumping capacitor configured to pump a first voltage of a first node, in response to a first clock signal, a gate pumping capacitor configured to pump a second voltage of a second node, in response to a second clock signal, a charge transfer transistor including a first source connected to a first one of a third node and the first node, a first gate connected to the second node, and a first drain connected to a remaining one of the first node and the third node, a gate control transistor including a second source connected to the first one of the third node and the first node, a second gate connected to the remaining one of the first node and the third node, and a second drain connected to the second node, and a gate discharge or charge unit.

16 Claims, 12 Drawing Sheets

(56) References Cited

U.S. PATENT DOCUMENTS

| | | | |
|---|---|---|---|
| 6,448,842 B2 * | 9/2002 | Zanuccoli | H02M 3/073 327/536 |
| 6,492,861 B2 * | 12/2002 | Rey | H02M 3/073 327/536 |
| 6,538,930 B2 * | 3/2003 | Ishii | G11C 5/145 327/534 |
| 6,812,773 B1 * | 11/2004 | Chou | H02M 3/073 327/536 |
| 6,878,981 B2 * | 4/2005 | Eshel | G11C 5/145 257/299 |
| 6,914,791 B1 * | 7/2005 | Park | H02M 3/073 327/536 |
| 7,030,683 B2 * | 4/2006 | Pan | H02M 3/073 327/536 |
| 7,342,438 B2 | 3/2008 | Muneer et al. | |
| 7,714,636 B2 * | 5/2010 | Chang | H02M 3/073 327/536 |
| 7,741,898 B2 | 6/2010 | Hsu | |
| 7,843,712 B2 | 11/2010 | Lee | |
| 8,232,833 B2 * | 7/2012 | Tran | H02M 3/073 327/536 |
| 8,339,187 B2 | 12/2012 | Tran et al. | |
| 8,427,229 B2 * | 4/2013 | Lin | G11C 5/145 327/536 |
| 8,487,690 B2 | 7/2013 | Wei et al. | |
| 2002/0089889 A1 | 7/2002 | Ishii et al. | |
| 2004/0183114 A1 | 9/2004 | Eshel | |
| 2004/0217803 A1 | 11/2004 | Chou | |
| 2008/0001651 A1 | 1/2008 | Muneer et al. | |
| 2008/0130329 A1 | 6/2008 | Lee | |
| 2008/0174360 A1 | 7/2008 | Hsu | |
| 2011/0169558 A1 | 7/2011 | Tran et al. | |
| 2012/0161857 A1 | 6/2012 | Sakaguchi | |
| 2012/0249224 A1 | 10/2012 | Wei et al. | |
| 2018/0083531 A1 | 3/2018 | Nguyen et al. | |

* cited by examiner

US 10,707,749 B2

CHARGE PUMP, AND HIGH VOLTAGE GENERATOR AND FLASH MEMORY DEVICE HAVING THE SAME

CROSS-REFERENCE TO THE RELATED APPLICATIONS

This U.S. non-provisional patent application claims priority under 35 U.S.C. § 119 to Korean Patent Application No. 10-2018-0088948, filed on Jul. 31, 2018, and Korean Patent Application No. 10-2018-0167133, filed on Dec. 21, 2018, the disclosures of which are incorporated herein by reference in their entireties.

BACKGROUND

1. Field

Devices and apparatuses consistent with example embodiments relate to a charge pump, and a high voltage generator and a flash memory device including the same.

2. Description of Related Art

In a flash memory device, a positive high voltage and a negative high voltage that are higher or lower than a voltage applied from the outside may be needed. To this end, the flash memory device may include a positive high voltage generator generating the positive high voltage by pumping the applied voltage, and a negative high voltage generator generating the negative high voltage by pumping the applied voltage. Accordingly, a circuit construction of the flash memory device may be complicated.

SUMMARY

According to example embodiments, there is provided a charge pump including a first pumping capacitor configured to pump a first voltage of a first node, in response to a first clock signal, a gate pumping capacitor configured to pump a second voltage of a second node, in response to a second clock signal, and a charge transfer transistor including a first source connected to a first one of a third node and the first node, a first gate connected to the second node, and a first drain connected to a remaining one of the first node and the third node. The charge pump further includes a gate control transistor including a second source connected to the first one of the third node and the first node, a second gate connected to the remaining one of the first node and the third node, and a second drain connected to the second node, and a gate discharge or charge unit configured to discharge or charge a charge of the second node.

According to example embodiments, there is provided a high voltage generator including a first predetermined number of boost-up or boost-down pumps configured to output, via a first output terminal, a positive or negative intermediate high voltage, by pumping an input voltage that is applied via an input terminal, the first predetermined number of boost-up or boost-down pumps being connected in series between the input terminal and the first output terminal, and a second predetermined number of boost-up or boost-down pumps configured to output, via a second output terminal, a positive or negative final high voltage, by pumping the positive or negative intermediate high voltage, the second predetermined number of boost-up or boost-down pumps being connected in series between the first output terminal and the second output terminal. Each of the first predetermined number of boost-up or boost-down pumps and the second predetermined number of boost-up or boost-down pumps includes a pumping capacitor configured to pump a first voltage of a first node, in response to a first clock signal or a third clock signal, a gate pumping capacitor configured to pump a second voltage of a second node, in response to a second clock signal or a fourth clock signal, and a charge transfer transistor including a first source connected to a first one of a third node and the first node, a first gate connected to the second node, and a first drain connected to a remaining one of the first node and the third node. Each of the first predetermined number of boost-up or boost-down pumps and the second predetermined number of boost-up or boost-down pumps further includes a gate control transistor including a second source connected to the first one of the third node or the first node, a second gate connected to the remaining one of the first node or the third node, and a second drain connected to the second node, and a gate discharge or charge unit configured to discharge or charge a charge of the second node.

According to example embodiments, there is provided a high voltage generator including a predetermined number of boost-up and boost-down pumps configured to output a positive high voltage via an output terminal, by boosting up an input voltage that is applied via an input terminal, and output a negative high voltage via the input terminal, by boosting down an output voltage that is applied via the output terminal. The predetermined number of boost-up or boost-down pumps is connected in series between the input terminal and the output terminal. Each of the predetermined number of boost-up and boost-down pumps includes a first pumping capacitor configured to pump a first voltage of a first node, in response to a first clock signal, a second pumping capacitor configured to pump a third voltage of a third node, in response to a third clock signal, and a gate pumping capacitor configured to pump a second voltage of a second node, in response to a second clock signal or a fourth clock signal. Each of the predetermined number of boost-up and boost-down pumps further includes a charge transfer transistor including a first source connected to the third node, a first gate connected to the second node, and a first drain connected to the first node, a gate control transistor including a second source connected to the third node, a second gate connected to the first node, and a second drain connected to the second node, and a gate discharge or charge unit configured to discharge or charge a charge of the second node.

According to example embodiments, there is provided a flash memory device including a flash memory cell array including a plurality of flash memory cells, and a first high voltage generator including a first charge pump that includes a first predetermined number of first boost-up pumps connected in series, the first high voltage generator being configured to output an intermediate high voltage via a first output terminal, by boosting up an input voltage that is applied via a first input terminal during a program operation, and output a first positive high voltage via a second output terminal, by boosting up the input voltage applied via the first input terminal during an erase operation. The flash memory device further includes a second high voltage generator including a second charge pump that includes a second predetermined number of second boost-up and boost-down pumps connected in series, the second high voltage generator being configured to output a second positive high voltage via a third output terminal, by boosting up the input voltage that is applied via a second input terminal during the program operation, and output a negative high voltage via the second input terminal, by boosting down an output voltage that is applied via the third output terminal during the erase operation. The flash memory device further includes a row driver configured to apply the intermediate high voltage and the second positive high voltage to the flash memory cell array during the program operation, and apply the first positive high voltage and the negative high voltage to the flash memory cell array during the erase operation.

DETAILED DESCRIPTION OF THE EXAMPLE EMBODIMENTS

Example embodiments of the inventive concept are directed to providing a charge pump generating either different positive (negative) high voltages or a positive or a negative high voltage, and a high voltage generator and a flash memory device including the same.

Hereinafter, a charge pump, and a high voltage generator and a flash memory device including the same according to the example embodiments of the inventive concept will be described with reference to the accompanying drawings below.

Figure 1:
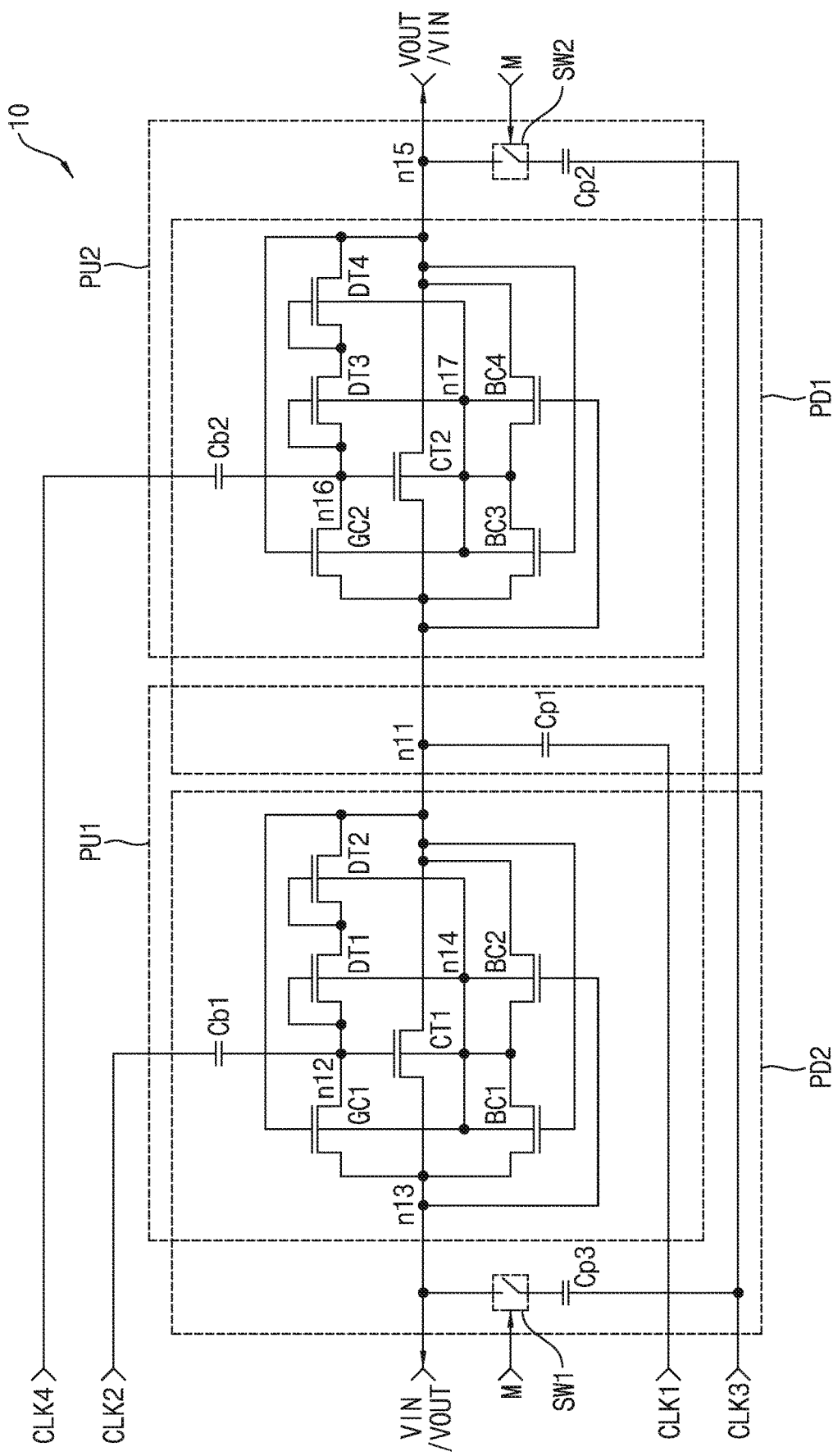
FIG. 1 is a circuit diagram illustrating a charge pump according to example embodiments.
Figure 2:
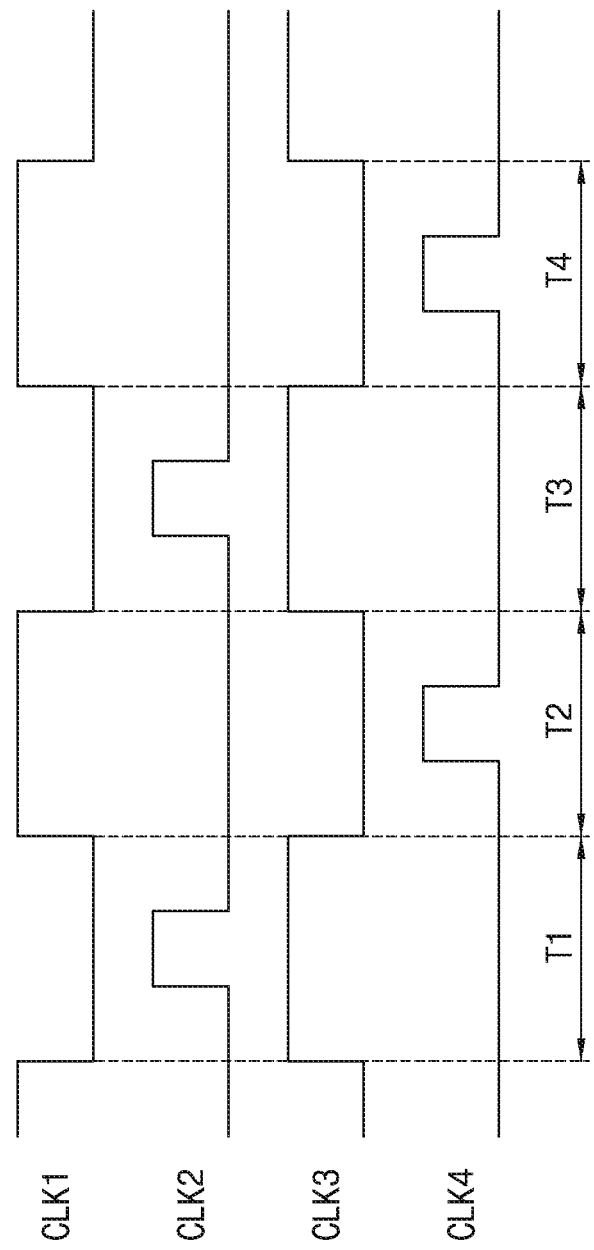
FIG. 2 is a timing diagram illustrating first to fourth clock signals CLK1 to CLK4 applied to the charge pump illustrated in FIG. 1.

FIG. 1 is a circuit diagram illustrating a charge pump according to example embodiments, and FIG. 2 is a timing diagram illustrating first to fourth clock signals CLK1 to CLK4 applied to the charge pump illustrated in FIG. 1.

Referring to FIG. 1, a charge pump 10 may include first and second boost-up pumps PU1 and PU2, first and second boost-down pumps PD1 and PD2, and first and second switches SW1 and SW2.

The first boost-up pump PU1 may include a first pumping capacitor Cp1, a first gate pumping capacitor Cb1, a first charge transfer transistor CT1, a first gate control transistor GC1, first and second body control transistors BC1 and BC2, and first and second gate discharge or charge transistors DT1 and DT2. The second boost-down pump PD2 may include a third pumping capacitor Cp3 and the first switch SW1, except the first pumping capacitor Cp1 of the first boost-up pump PU1. The first and second gate discharge or charge transistors DT1 and DT2 may be embodiments of a gate discharge or charge unit. Unlike that illustrated in the drawings, the first and second gate discharge or charge transistors DT1 and DT2 may include one gate discharge or charge transistor or at least three gate discharge or charge transistors connected in series. That is, the first and second gate discharge or charge transistors DT1 and DT2 may include at least one discharge or charge transistor.

The second boost-up pump PU2 may include a second pumping capacitor Cp2, a second gate pumping capacitor Cb2, a second charge transfer transistor CT2, a second gate control transistor GC2, third and fourth body control transistors BC3 and BC4, third and fourth gate discharge or charge transistors DT3 and DT4, and the second switch SW2. The first boost-down pump PD1 may include the first pumping capacitor Cp1 of the first boost-up pump PU1, except the second pumping capacitor Cp2 of the second boost-up pump PU2. The third and fourth gate discharge or charge transistors DT3 and DT4 may be embodiments of a gate discharge or charge unit. Unlike that illustrated in the drawings, the third and fourth gate discharge or charge transistors DT3 and DT4 may include one gate discharge or charge transistor or at least three gate discharge or charge transistors connected in series. That is, the third and fourth gate discharge or charge transistors DT3 and DT4 may include at least one gate discharge or charge transistor.

Each of the first charge transfer transistor CT1, the first gate control transistor GC1, the first and second body control transistors BC1 and BC2, the second charge transfer transistor CT2, the second gate control transistor GC2, and the third and fourth body control transistors BC3 and BC4 may be an n-type metal oxide semiconductor (NMOS) transistor.

Referring to FIGS. 1 and 2, when a mode signal M is at a "low" level, the first switch SW1 may be turned off and the second switch SW2 may be turned on. The first clock signal CLK1 may be at a "high" level (e.g., a supply voltage VDD or a voltage 2VDD) when the second clock signal CLK2 is at a "low" level (e.g., a ground voltage VSS), and the second clock signal CLK2 may be at a "high" level when the first clock signal CLK1 is at a "low" level. Similarly, the third clock signal CLK3 may be at a "high" level when the fourth clock signal CLK4 is at a "low" level, and the fourth clock signal CLK4 may be at a "high" level when the third clock signal CLK3 may be at a "low" level. The first and second boost-up pumps PU1 and PU2 may perform a –boost-up operation of generating a positive high voltage (e.g., a voltage 3VDD) via the output/input terminal VOUT/VIN by boosting up a voltage (e.g., the supply voltage VDD) supplied via an input/output terminal VIN/VOUT in response to the first to fourth clock signals CLK1 to CLK4.

In contrast, when the mode signal M is at a "high" level, the first switch SW1 may be turned on and the second switch SW2 may be turned off. The first and second boost-down pumps PD1 and PD2 may perform a boost-down operation of generating a negative high voltage (e.g., –2VDD) via the input/output terminal VIN/VOUT by boosting down a voltage (e.g., the ground voltage VSS) supplied via the output/input terminal VOUT/VIN in response to the first to fourth clock signals CLK1 to CLK4.

Functions of the components illustrated in FIG. 1 will be described below.

The first pumping capacitor Cp1 may be connected to a first node n11 and may pump a first voltage of the first node n11 in response to the first clock signal CLK1.

The first gate pumping capacitor Cb1 may be connected to a second node n12 and may pump a second voltage of the second node n12 in response to the second clock signal CLK2.

The first charge transfer transistor CT1 may include a first source connected to a third node n13, a first gate connected to the second node n12, a first drain connected to the first node n11, and a first body connected to a fourth node n14, and may be turned on in response to the second voltage of the second node n12 to transfer a charge to the first node n11 from the third node n13, which is an input terminal.

The first gate control transistor GC1 may include a second gate connected to the first node n11, a second source connected to the third node n13, a second drain connected to the second node n12, and a second body connected to the fourth node n14, and may be turned on in response to the first voltage of the first node n11 to transfer a charge to the second node n12 from the third node n13.

The first body control transistor BC1 may include a fourth source connected to the third node n13, a fourth gate connected to the first node n11, and a fourth drain and a fourth body connected to the fourth node n14, and may be turned on in response to a third voltage of the third node n13 to transfer a charge to the fourth node n14 connected to the fourth body from the third node n13.

The second body control transistor BC2 may include a fifth source connected to the first node n11, a fifth gate connected to the third node n13, and a fifth drain and a fifth body connected to the fourth node n14, and may be turned on in response to the third voltage of the third node n13 to transfer a charge to the fourth node n14 from the first node n13.

The third pumping capacitor Cp3 may be connected to the third node n13 and may pump the third voltage of the third node n13 in response to the third clock signal CLK3.

The first and second gate discharge or charge transistors DT1 and DT2 may be connected in series between the second node n12 and the first node n11, and may each include a third body connected to the fourth node n14. For example, the first gate discharge or charge transistor DT1 may include a third gate and a third source that are connected to the second node n12, and the second gate discharge or charge transistor DT2 may include a third drain connected to the first node n11. The first and second gate discharge or charge transistors DT1 and DT2 may have diode constructions and may discharge or charge a charge of the second node n12. During a discharge operation or a charge operation, the second voltage of the second node n12 may be equal to the sum of the first voltage of the first node n11 and 2Vth (here, Vth may represent a threshold voltage of each of the first and second gate discharge or charge transistors DT1 and DT2). The first and second gate discharge or charge transistors DT1 and DT2 may not be operated unless the first voltage of the first node n11 is higher by 2Vth than that of second node n12. That is, the first and second gate discharge or charge transistors DT1 and DT2 may be operated only during the discharge operation or the charge operation after a pumping operation (a boost-up operation or a boost-down operation), and may be operated during the pumping operation. Unlike that illustrated in the drawings, three or more gate discharge and charge transistors may be connected between the second node n12 and the first node n11.

In conclusion, the first boost-up pump PU1 may perform the boost-up operation in response to the first clock signal CLK1 and the second clock signal CLK2 and output a boost-up voltage to the first node n11, and the second boost-down pump PD2 may perform the boost-down operation in response to the third clock signal CLK3 and the second clock signal CLK2 and output a boost-down voltage to the third node n13.

The second boost-up pump PU2 may be configured to be the same as the first boost-up pump PU1 between the first node n1, a fifth node n15, a sixth node n16, and a seventh node n17. Similarly, the first boost-down pump PD1 may be configured to be the same as the second boost-down pump PD2 between the first node n1, the fifth node n15, the sixth node n16, and the seventh node n17. The operations of the second pumping capacitor Cp2, the second gate pumping capacitor Cb2, the second charge transfer transistor CT2, the second gate control transistor GC2, the third and fourth body control transistors BC3 and BC4, the third and fourth gate discharge or charge transistors DT3 and DT4, and the first pumping capacitor Cp1 may correspond to those of the first pumping capacitor Cp1, the first gate pumping capacitor Cb1, the second charge transfer transistor CT1, the second gate control transistor GC1, the first and second body control transistors BC1 and BC2, the first and second gate discharge or charge transistors DT1 and DT2, and the third pumping capacitor Cp3 described above.

In conclusion, the second boost-up pump PU2 may perform the boost-up operation in response to the third clock signal CLK3 and the fourth clock signal CLK4 and generate a boost-up voltage to the fifth node n15, and the first boost-down pump PD1 may perform the boost-down operation in response to the first clock signal CLK1 and the fourth clock signal CLK4 and generate a boost-down voltage to the first node n11.

A boost-up operation performed by the charge pump 10 according to an embodiment of the inventive concept will be described below with reference to FIGS. 1 and 2. In a second period T2, when the first clock signal CLK1 is at a "high" level and the second clock signal CLK2 is a "low" level, the first pumping capacitor Cp1 may perform the pumping operation to pump the first node n11 (previously charged to the supply voltage VDD) to the voltage 2VDD, and the first gate pumping capacitor Cb1 may provide 0 V with the second node n12. The first gate control transistor GC1 may be turned on to transfer a charge of the supply voltage VDD to the second node n12. The first charge transfer transistor CT1 may be turned off.

In this case, the first voltage of the first node n11 may be higher than that of the third node n13. Accordingly, the first body control transistor BC1 may be turned on and thus the fourth node n14 connected to the fourth body thereof may be biased by the supply voltage VDD. Accordingly, an undesired increase in the threshold voltage Vth due to a body effect of the first gate control transistor GC1 may be prevented.

Furthermore, in the second period T2, when the third clock signal CLK3 is at a "low" level and the fourth clock signal CLK4 is at the "high" level, the second gate pumping capacitor Cb2 may perform the pumping operation to pump the sixth node n16 (previously charged to the voltage 2VDD) to the voltage 3VDD. Thus, the second charge transfer transistor CT2 may be turned on to transfer a charge from the first node n11 to the fifth node n15. Accordingly, the second gate control transistor GC2 may be turned off.

In this case, the first voltage of the first node n11 may be higher than that of the fifth node n15. Accordingly, the fourth body control transistor BC4 may be turned on and thus the seventh node n17 may be biased by the voltage 2VDD. Accordingly, an undesired increase in the threshold voltage due to a body effect of the second charge transfer transistor CT2 may be prevented.

In a third period T3, when the first clock signal CLK1 is at a "low" level and the second clock signal CLK2 is at a "high" level, the first gate pumping capacitor Cb1 may perform the pumping operation to pump the second node n12 (previously charged to the supply voltage VDD) to the voltage 2VDD. The first charge transfer transistor CT1 may be turned on to transfer a charge from the third node n13 to the first node n11. Accordingly, the first gate control transistor GC1 may be turned off.

In this case, the third voltage of the third node n13 may be higher than the first voltage of first node n11. Accordingly, the second body control transistor BC2 may be turned on and thus the fourth node n14 may be biased by the supply voltage VDD. Accordingly, an undesired increase in the threshold voltage due to an effect of the first body of the first charge transfer transistor CT1 may be prevented.

Furthermore, in the third period T3, when the third clock signal CLK3 is at a "high" level and the fourth clock signal CLK4 is at a "low" level, the second pumping capacitor Cp2 may perform the pumping operation to pump the fifth node n15 (previously charged to the voltage 2VDD) to the voltage 3VDD, and the second gate pumping capacitor Cb2 may provide 0 V with the sixth node n16. The second charge transfer transistor CT2 may be turned off. The second gate control transistor GC2 may be turned on to provide the voltage 2VDD with the sixth node n16.

In this case, a voltage of the fifth node n15 may be higher than that of the first node n12. Accordingly, the third body control transistor BC3 may be turned on and thus the seventh node n17 may be biased by the voltage 2VDD. Accordingly, an undesired increase in the threshold voltage due to a body effect of the second gate control transistor GC2 may be prevented.

In response to the first to fourth clock signals CLK1 to CLK4, the first boost-up pump PU1 and the second boost-up pump PU2 may repeatedly perform the boost-up operation to boost up the first voltage of the first node n11 to the voltage 2VDD and the voltage of the fifth node n15 to the voltage 3VDD.

A boost-down operation performed by the charge pump 10 according to an embodiment of the inventive concept will be described below with reference to FIGS. 1 and 2.

In the second period T2, when the first clock signal CLK1 is at a "high" level and the fourth clock signal CLK4 is at the "high" level, the second gate pumping capacitor Cb2 may provide 0 V with the sixth node n16 (previously discharged to a voltage −VDD). The second charge transfer transistor CT2 may be turned on to transfer a charge from the first node n11 to the fifth node n15. The first pumping capacitor Cp1 may perform the pumping operation to pump the first node n11 to a voltage −VDD. In this case, the second gate control transistor GC2 may be turned on to transfer a charge of the voltage −VDD to the sixth node n16. The second charge transfer transistor CT2 may be turned off.

In this case, the voltage of the fifth node n11 may be higher than that of the first node n15. Accordingly, the third body control transistor BC3 may be turned on and thus the seventh node n17 may be biased by the voltage −VDD. Thus, an undesired increase in the threshold voltage due to a body effect of the second gate control transistor GC2 may be prevented.

Furthermore, in the second period T2, when the second clock signal CLK2 is at a "high" level and the third clock signal CLK3 is at a "low" level, the third pumping capacitor Cp3 and the first gate pumping capacitor Cb1 may not perform the pumping operation.

In the third period T3, when the first clock signal CLK1 is at a "low" level and the fourth clock signal CLK4 is at a "low" level, the first pumping capacitor Cp1 and the second gate pumping capacitor Cb2 may not perform the pumping operation.

Furthermore, in the third period T3, when the second clock signal CLK2 is at a "high" level and the third clock signal CLK3 is at a "high" level, the first gate pumping capacitor Cb1 may perform the pumping operation to pump the second node n12 (previously discharged to the voltage −2VDD) to the voltage −VDD. The first charge transfer transistor CT1 may be turned on to transfer a charge from the third node n13 to the first node n11. The third pumping capacitor Cp3 may perform the pumping operation to pump the third node n13 (previously discharged to the voltage −VDD) to the voltage −2VDD. In this case, the first gate control transistor GC1 may be turned on to transfer the voltage −2VDD to the second node n16. The first charge transfer transistor CT1 may be turned off.

In this case, the third voltage of the third node n13 may be higher than the first voltage of the first node n11. Accordingly, the first body control transistor BC1 may be turned on and thus the fourth node n14 may be biased by the voltage −2VDD. Thus, an undesired increase in the threshold voltage due to a body effect of the first gate control transistor GC1 may be prevented.

In response to the first to fourth clock signals CLK1 to CLK4, the first boost-down pump PD1 and the second boost-down pump PD2 may repeatedly perform the boost-down operation and provide the voltage −2VDD with the third node n13.

After the boost-up operation or the boost-down operation, the charge pump 10 may perform the discharge operation or the charge operation. During the discharge operation or the charge operation, charges may be discharged or charged from the input/output terminal VIN/VOUT to the output/input terminal VOUT/VIN via the first and second charge transfer transistors CT1 and CT2.

During the discharge operation, as the voltages of the first node n11 and the fifth node n15 are reduced, the voltages of the second node n12 and sixth node n16 may be reduced by the first and second gate discharge or charge transistors DT1 and DT2 and the third and fourth gate discharge or charge transistors DT3 and DT4. For example, when the voltages of the first node n11 and the fifth node n15 are reduced to 1 V, the voltages of the second node n12 and the sixth node n16 may be reduced to a voltage 1V+2Vth. During the charge operation, as the voltages of the first node n11 and the fifth node n15 are increased, the voltages of the second node n12 and the sixth node n16 may be increased by the first and second gate discharge or charge transistors DT1 and DT2 and the third and fourth gate discharge or charge transistors DT3 and DT4. For example, when the voltages of the first node n11 and fifth node n15 are increased to 1 V, the voltages of the second node n12 and the sixth node n16 may be increased to a voltage 1V+2Vth.

Accordingly, in the charge pump 10 according to an embodiment of the inventive concept, during the discharge operation after the boost-up operation and during the charge operation after the boost-down operation, not only the first node n11 and the fifth node n15 but also the second node n12 and the sixth node n16 are discharged or charged, thereby precisely performing the boost-up operation and the boost-down operation.

Although the inventive concept has been illustrated and described above by distinguishing the charge pump from the boost-up pump and the boost-down pump for convenience of explanation, actually, a charge pump according to an embodiment of the inventive concept may have a structure in which a plurality of boost-up pumps are connected in series.

Although the charge pump 10 of FIG. 1 described above is illustrated as including the two-stage boost-up pumps PU1 and PU2 and the two-stage boost-down pumps PD1 and PD2, a charge pump according to an embodiment of the inventive concept may include the one-stage boost-up pump PU1, the one-stage boost-down pump PD1, or both the one-stage boost-up pump PU1 and the one-stage boost-down pump PD2, unlike that illustrated in FIG. 1. When the charge pump 10 of FIG. 1 includes the one-stage boost-up pump PU1 and the one-stage boost-down pump PD2, the first node n11 may function as the output/input terminal VOUT/VIN. When the charge pump 10 of FIG. 1 includes the one-stage boost-up pump PU1 and the one-stage boost-down pump PD2, the boost-up operation may be performed in response to the first clock signal CLK1 that is at the "high" level and the second clock signal CLK2 that is at the "low" level illustrated in FIG. 2, and the boost-down operation may be performed in response to the third clock signal CLK3 that is at the "high" level and the second clock signal CLK2 that is at the "high" level illustrated in FIG. 2, as is apparent from the boost-up operation and the boost-down operation described above.

In addition, the charge pump 10 of FIG. 1 described above includes the first and second body control transistors BC1 and BC2 and the third and fourth body control transistors BC3 and BC4 but the first to fourth body control transistors BC1 to BC4 may be omitted unlike that illustrated in FIG. 1.

Figure 3:
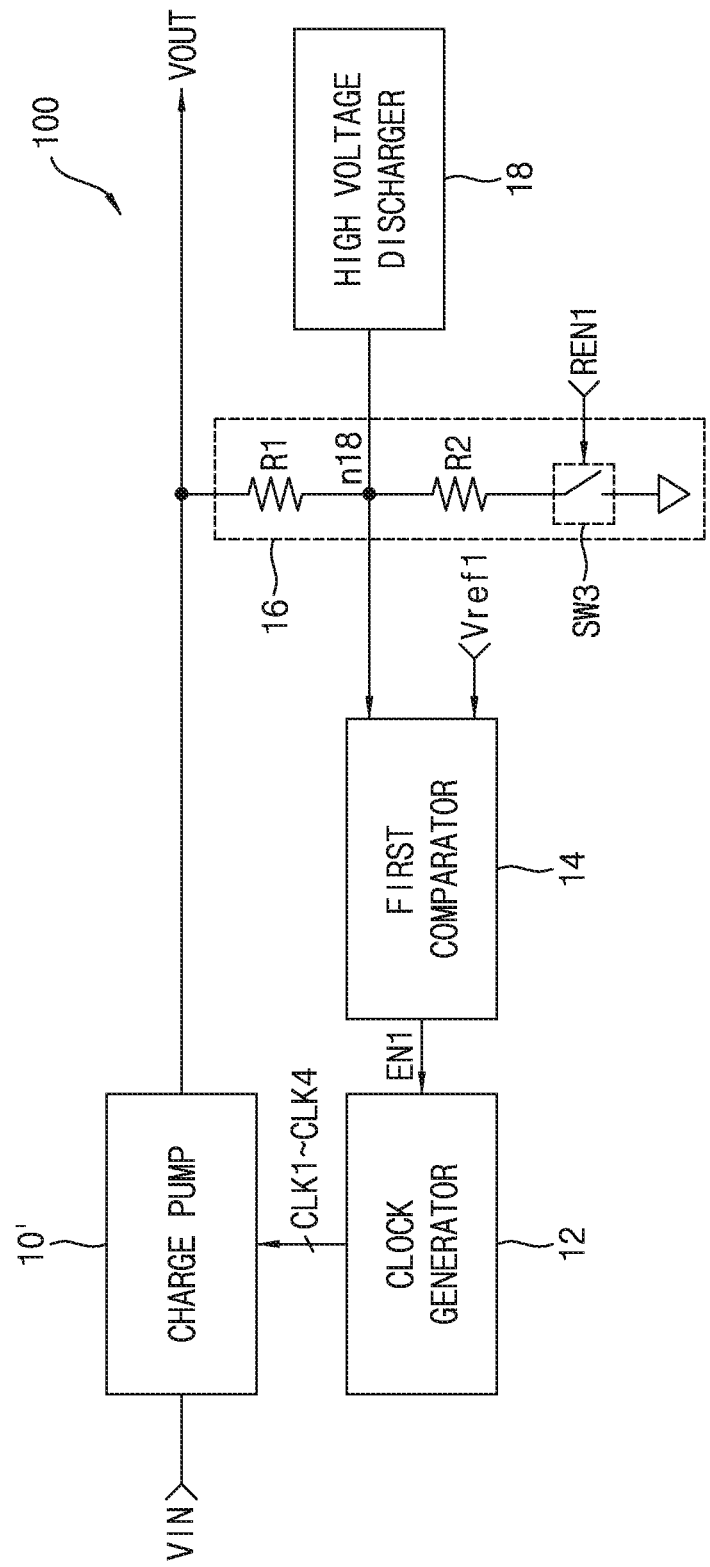
FIG. 3 is a diagram illustrating a high voltage generator according to example embodiments.
Figure 4:
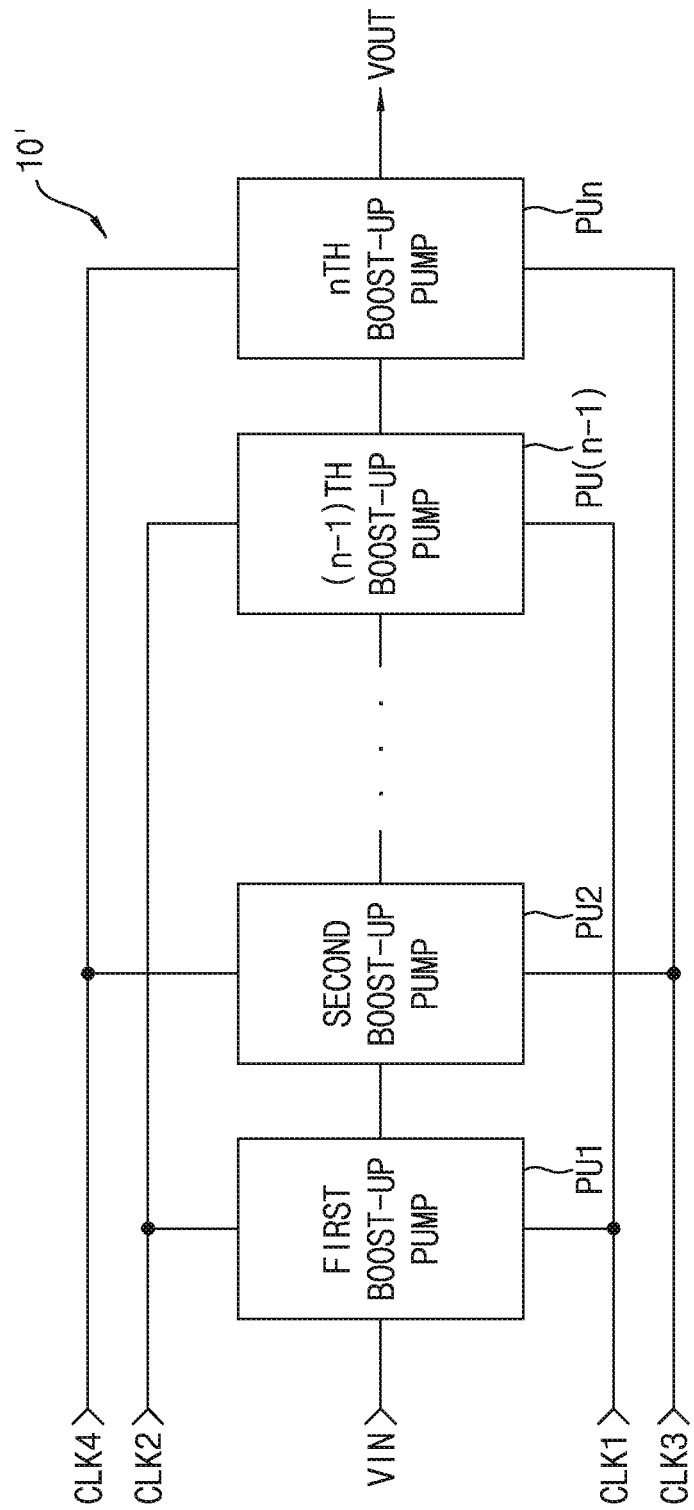
FIG. 4 is a block diagram illustrating a charge pump included in the high voltage generator illustrated in FIG. 3.

FIG. 3 is a diagram illustrating a high voltage generator according to example embodiments, and FIG. 4 is a block diagram illustrating a charge pump included in the high voltage generator illustrated in FIG. 3.

Referring to FIG. 3, a high voltage generator 100 may include a charge pump 10', a clock generator 12, a first comparator 14, a first regulator 16, and a high voltage discharger 18. The first regulator 16 may include first and second resistors R1 and R2, and a third switch SW3.

Functions of the blocks illustrated in FIG. 3 will be described below.

The charge pump 10' may output a positive high voltage via an output terminal VOUT by pumping a voltage (e.g., a supply voltage VDD) applied via an input terminal VIN, in response to first to fourth clock signals CLK1 to CLK4. The charge pump 10' may include the first boost-up pump PU1 and the second boost-up pump PU2 illustrated in FIG. 1 but may not include the second switch SW2, and a second pump capacitor Cp2 may be directly connected to a fifth node n15.

The charge pump 10' may have a structure in which first to $n^{th}$ boost-up pumps PU1 to PUn are connected in series as illustrated in FIG. 4. In this case, each of odd-numbered boost-up pumps among the first to $n^{th}$ boost-up pumps PU1 to PUn may perform the boost-up operation in response to a first clock signal CLK1 and a second clock signal CLK2 and each of the other even-numbered boost-up pumps may perform the boost-up operation in response to a third clock signal CLK3 and a fourth clock signal CLK4 so that when a supply voltage VDD is applied via the input terminal VIN, a positive high voltage (n+1) VDD may be output via the output terminal VOUT. For example, when n is ten, the charge pump 10' may generate a positive high voltage 11 VDD.

Referring again to FIG. 3, clock generator 12 may be enabled to generate the first to fourth clock signals CLK1 to CLK4 as illustrated in FIG. 2, in response to a first enable signal EN1.

The first comparator 14 may compare a voltage of an eighth node n18 with a first reference voltage Vref1 and may activate a first enable signal EN1 when the voltage of the eighth node n18 is lower than the first reference voltage Vref1 and deactivate the first enable signal EN1 when the voltage of the eighth node n18 is equal to or greater than the first reference voltage Vref1.

When the third switch SW3 is turned on in response to a first regulator enable signal REN1, the first regulator 16 may be enabled to divide a voltage of the output terminal VOUT by the first and second resistors R1 and R2 and generate the divided voltage via the eighth node n18.

The high voltage discharger 18 may discharge the voltage of the output terminal VOUT. For example, after the voltage of the output terminal VOUT reaches a target positive high voltage VPP, when the third switch SW3 is turned off in response to the first regulator enable signal REN1, the positive high voltage VPP may be discharged to the output terminal VOUT.

Figure 5:
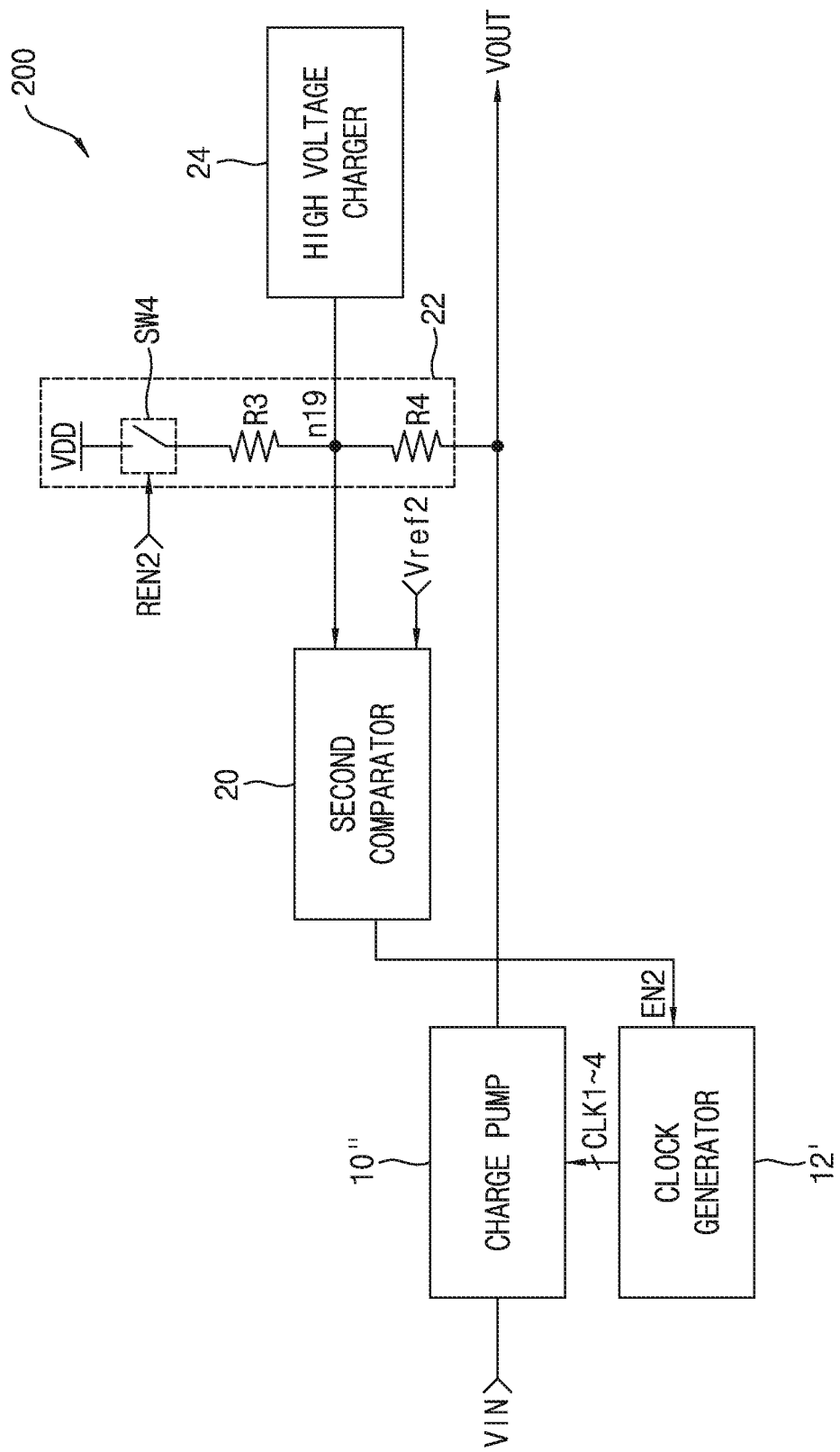
FIG. 5 is a diagram illustrating a high voltage generator according to example embodiments.
Figure 6:
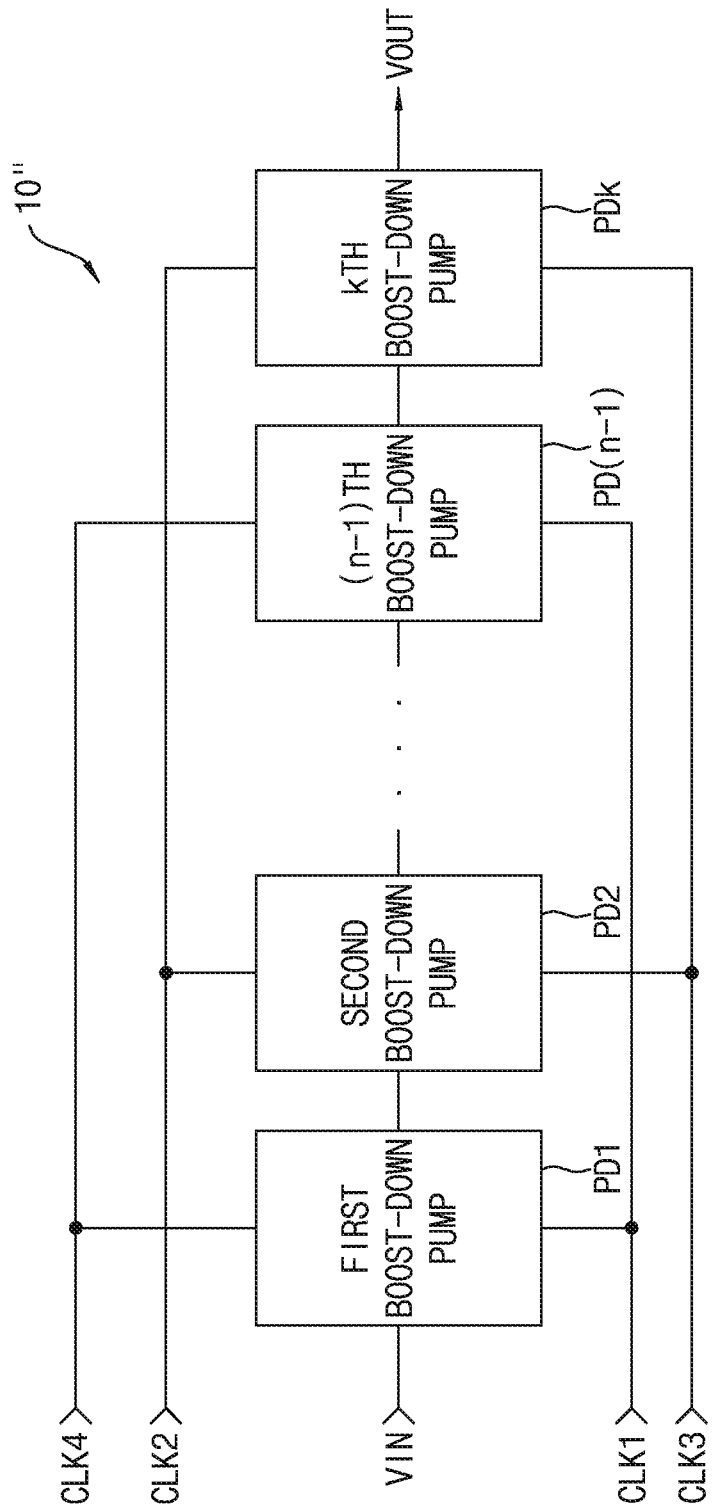
FIG. 6 is a block diagram illustrating a charge pump included in the high voltage generator illustrated in FIG. 5.

FIG. 5 is a diagram illustrating a high voltage generator according to example embodiments, and FIG. 6 is a block diagram illustrating a charge pump included in the high voltage generator illustrated in FIG. 5.

Referring to FIG. 5, a high voltage generator 200 may include a charge pump 10", a clock generator 12', a second comparator 20, a second regulator 22, and a high voltage charger 24. The second regulator 22 may include a fourth switch SW4, and third and fourth resistors R3 and R4.

Functions of the blocks illustrated in FIG. 5 will be described below.

The charge pump 10" may generate a negative high voltage via an output terminal VOUT by pumping a voltage (e.g., a ground voltage VSS) applied via an input terminal VIN, in response to first to fourth clock signals CLK1 to CLK4. The charge pump 10" may include the first boost-down pump PD1 and the second boost-down pump PD2 illustrated in FIG. 1 but may not include the second switch SW2, and a third pump capacitor Cp3 may be connected to a third node n13.

The charge pump 10" may have a structure in which first to $k^{th}$ boost-down pumps PD1 to PDk are connected in series as illustrated in FIG. 6. In this case, each of odd-numbered boost-down pumps among the first to $k^{th}$ boost-down pumps PD1 to PDk may perform the boost-down operation in response to the first clock signal CLK1 and fourth clock signal CLK4 and each of the other even-numbered boost-down pumps may perform the boost-down operation in response to the third clock signal CLK3 and the second clock signal CLK2 so that when the ground voltage VSS is applied via the input terminal VIN, a negative high voltage −nVDD may be output via the output terminal VOUT. For example, when k is ten, the charge pump 10" may generate a negative high voltage −10VDD.

Referring again to FIG. 5, the clock generator 12 may be enabled to generate the first to fourth clock signals CLK1 to CLK4 as illustrated in FIG. 2, in response to a second enable signal EN2.

The second comparator 20 may compare a voltage of a ninth node n19 with a second reference voltage Vref2 and may activate the second enable signal EN2 when the voltage of the ninth node n19 is higher than the second reference voltage Vref2 and deactivate the second enable signal EN2 when the voltage of the ninth node n19 is less than or equal to the second reference voltage Vref2.

When the fourth switch SW4 is turned on in response to the second regulator enable signal REN2, the second regulator 22 may be enabled to divide a voltage of the input terminal VIN by the third and fourth resistors R3 and R4 and output a divided voltage via the ninth node n19.

The high voltage charger 24 may charge the input terminal VIN with a negative high voltage. For example, after the voltage of the input terminal VIN reaches a target negative high voltage, when the fourth switch SW4 is turned off in response to the second regulator enable signal REN2, the input terminal VIN may be charged to the negative high voltage.

Figure 7:
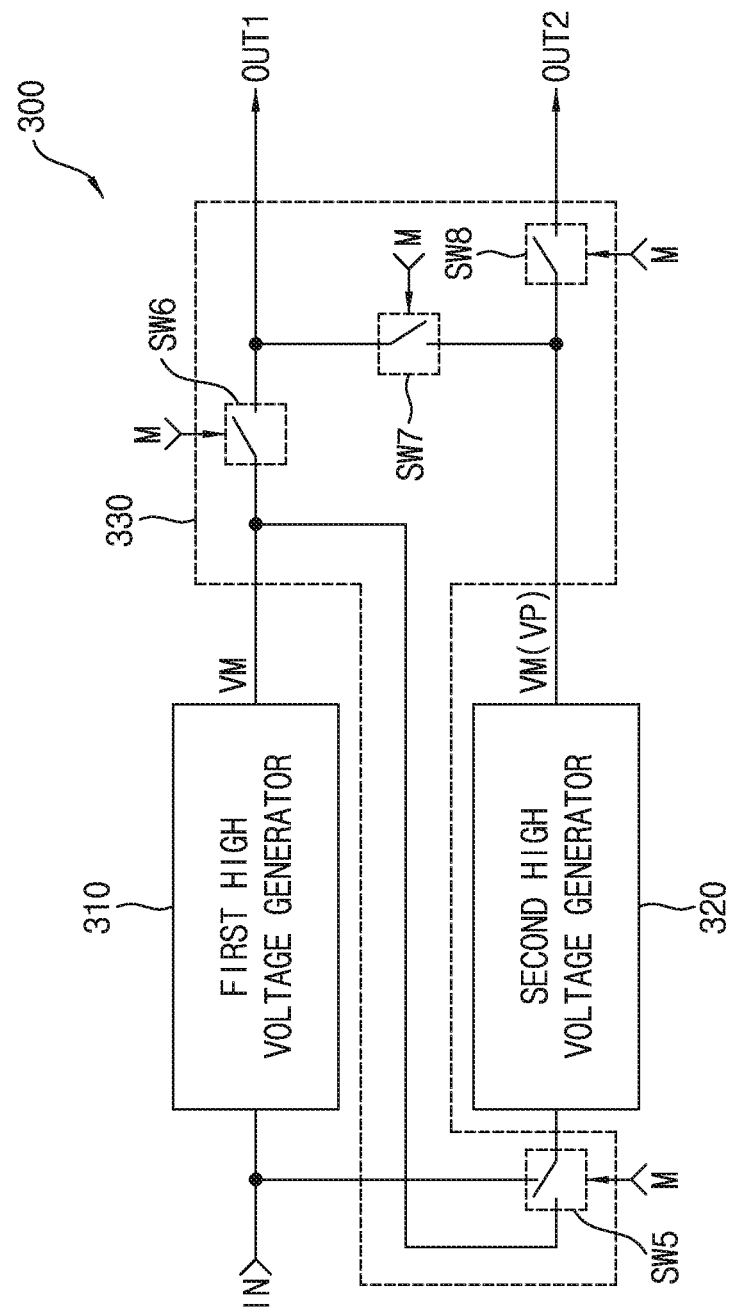
FIG. 7 is a diagram illustrating a high voltage generator according to example embodiments.

FIG. 7 is a diagram illustrating a high voltage generator according to example embodiments.

Referring to FIG. 7, a high voltage generator 300 may include first and second high voltage generators 310 and 320 and a switching unit 330. The switching unit 330 may include fifth to eighth switches SW5 to SW8.

Functions of the blocks illustrated in FIG. 7 will be described below.

The first high voltage generator 310 may generate an intermediate high voltage VM by pumping an input voltage (e.g., a supply voltage VDD) applied via an input terminal IN.

The second high voltage generator 320 may generate a final high voltage VP by pumping the input voltage IN or the intermediate high voltage VM applied via the fifth switch SW5.

Each of the first and second high voltage generators 310 and 320 may have the same configuration as the high voltage generator 100 of FIG. 3 or the high voltage generator 200 of FIG. 5.

The fifth switch SW5 may output a voltage of the input terminal IN to the second high voltage generator 320 when a mode signal M is at a "low" level and output the intermediate high voltage VM to the second high voltage generator 320 when the mode signal M is at the "high" level.

The sixth switch SW6 may be turned on to output the intermediate high voltage VM via a first output terminal OUT1 when the mode signal M is at the "low" level.

The seventh switch SW7 may be turned on to output the intermediate high voltage VM via the first output terminal OUT1 when the mode signal M is at the "low" level.

The eighth switch SW8 may be turned on to output the final high voltage VP via a second output terminal OUT2 when the mode signal M is at the "high" level.

That is, the high voltage generator 300 of FIG. 7 may output the intermediate high voltage VM output from the first high voltage generator 310 and the second high voltage generator 320 via the first output terminal OUT1 when the mode signal M is at the "low" level and may output the final high voltage VP output from the first high voltage generator 310 and the second high voltage generator 320 via the second output terminal OUT2 when the mode signal M is at the "high" level.

The high voltage generator 300 of FIG. 7 may generate two different positive high voltages or two different negative high voltages according to the mode signal M. For example, the intermediate high voltage VM may be 5VDD, and the high voltage VP may be 10VDD. Alternatively, the intermediate high voltage VM may be −5VDD, and the high voltage VP may be −10VDD.

The high voltage generator 300 of FIG. 7 may have a structure in which the first high voltage generator 310 and the second high voltage generator 320 which generate the same intermediate high voltage VM are connected in parallel to generate the intermediate high voltage VM. Alternatively, unlike that illustrated in FIG. 7, one of the first high voltage generator 310 and the second high voltage generator 320 may be configured to generate the intermediate high voltage VM by pumping the voltage of the input terminal IN.

Figure 8:
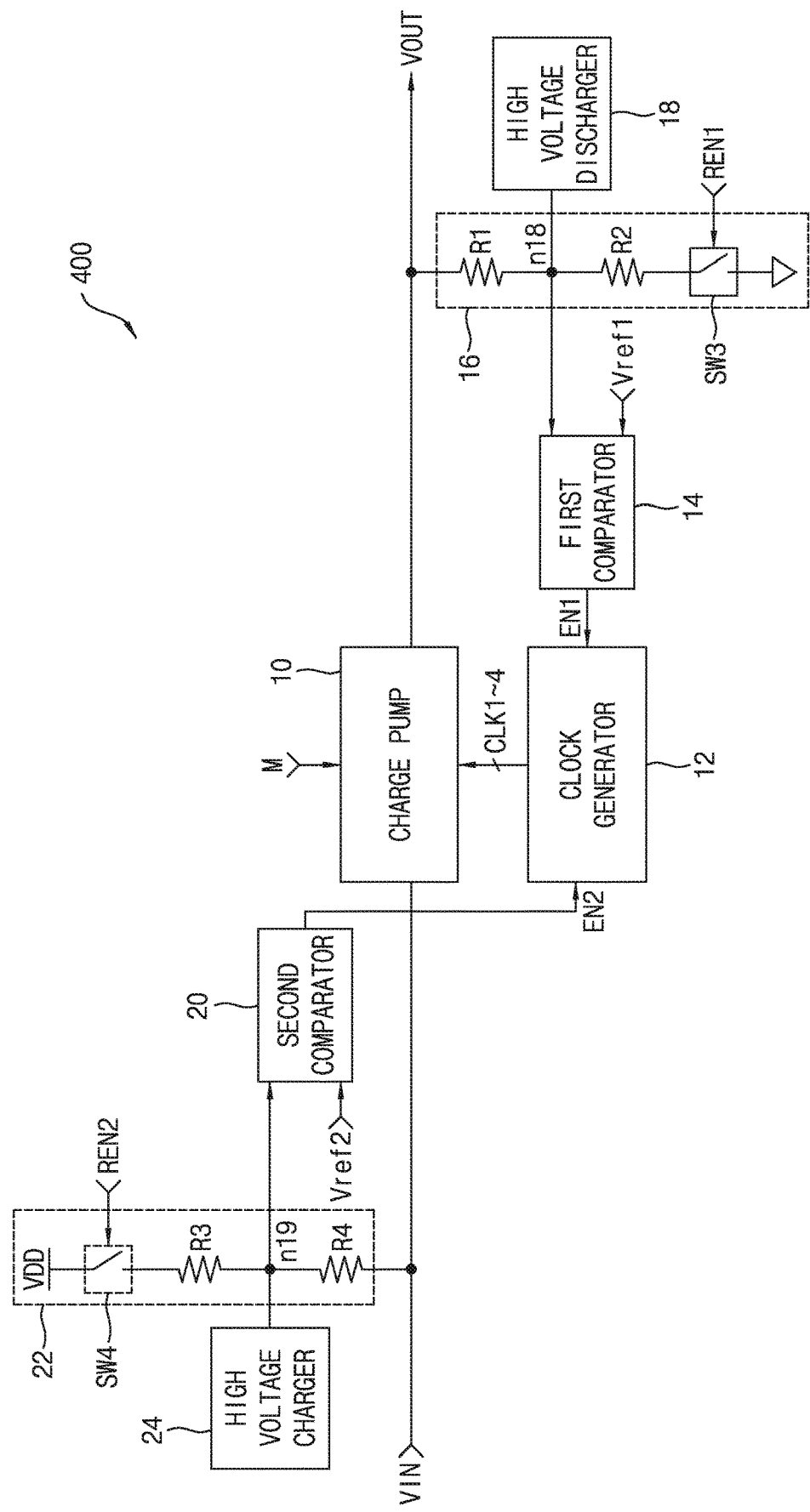
FIG. 8 is a diagram illustrating a high voltage generator according to example embodiments.

FIG. 8 is a diagram illustrating a high voltage generator according to example embodiments.

Referring to FIG. 8, a high voltage generator 400 may further include the second comparator 20, the second regulator 22, and the high voltage charger 24 illustrated in FIG. 5, in addition to the configuration of the high voltage generator 100 illustrated in FIG. 3.

Functions of the blocks illustrated in FIG. 8 will be easily understood by referring to the above-described functions of the blocks illustrated in FIGS. 3 and 5 and thus a description thereof will be omitted.

When a mode signal M is at a "low" level, the charge pump 10 may output a positive high voltage via an output terminal VOUT by boosting an input voltage (e.g., a supply voltage VDD) applied via an input terminal VIN, in response to first to fourth clock signals CLK1 to CLK4.

In contrast, when the mode signal M is at a "high" level, the charge pump 10 may output a negative high voltage via an input terminal VIN by boosting down an input voltage (e.g., a ground voltage VSS) applied via the output terminal VOUT, in response to the first to fourth clock signals CLK1 to CLK4.

The charge pump 10 may be configured as illustrated in FIG. 1 or may have a structure in which i boost-up pumps PU1 to PUn or i boost-down pumps PD1 to PDn are connected in series, unlike that illustrated in FIG. 1.

The clock generator 12 may generate the first to fourth clock signals CLK1 to CLK4 in response to a first enable signal EN1 when the mode signal M is at the "high" level and may generate the first to fourth clock signals CLK1 to CLK4 in response to a second enable signal EN2 when the mode signal M is at the "low" level. The first to fourth clock signals CLK1 to CLK4 may be generated as illustrated in FIG. 2.

When the mode signal M is at the "low" level, the first comparator 14, the first regulator 16, and the high voltage discharger 18 may perform an operation as described above with reference to FIG. 3.

When the mode signal M is at the "high" level, the second comparator 20, the second regulator 22, and the high voltage charger 24 may perform an operation as described above with reference to FIG. 5.

That is, when the mode signal M is at the "low" level, the high voltage generator 400 of FIG. 8 may output the positive high voltage via the output terminal VOUT by boosting the input voltage (e.g., the supply voltage VDD) applied via the input terminal VIN. When the mode signal M is at the "high" level, the high voltage generator 400 may output the negative high voltage via the input terminal VIN by boosting down the input voltage (e.g., the ground voltage VSS) applied via the output terminal VOUT.

Figure 9:
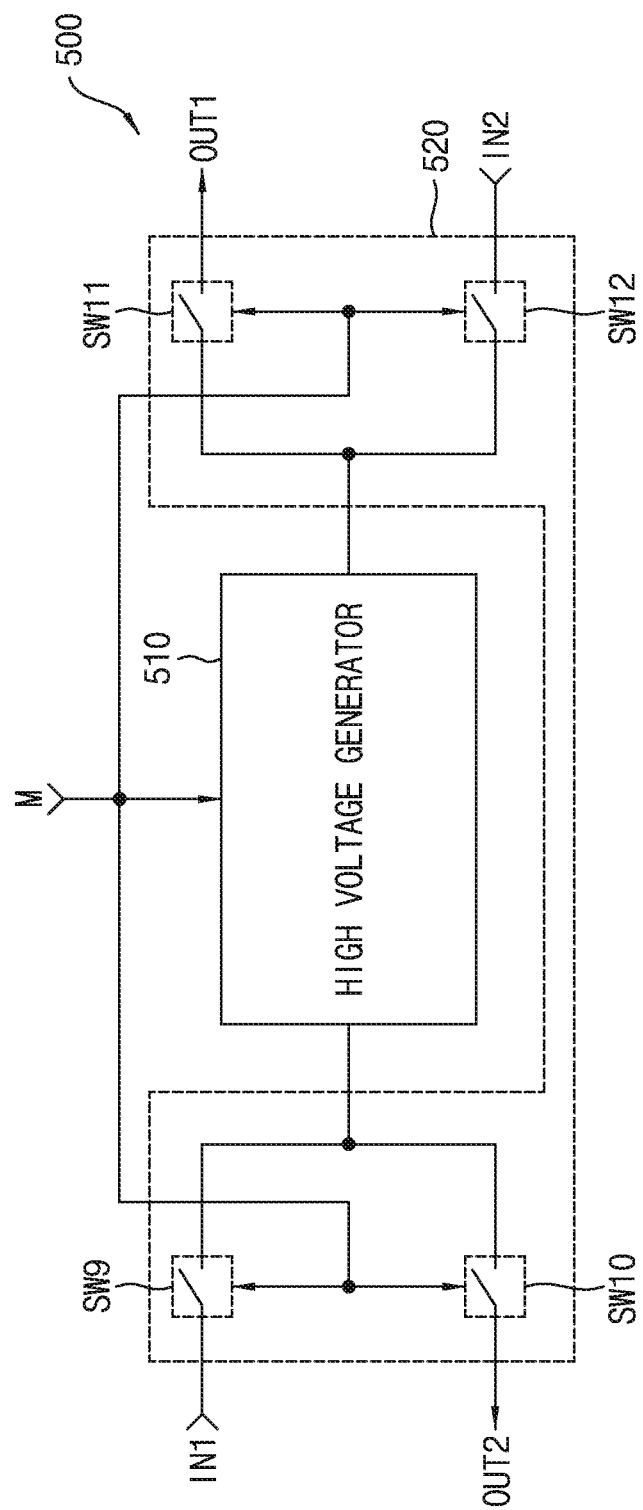
FIG. 9 is a diagram illustrating a high voltage generator according to example embodiments.

FIG. 9 is a diagram illustrating a high voltage generator according to example embodiments.

Referring to FIG. 9, a high voltage generator 500 may include a high voltage generator 510 and a switching unit 520. The switching unit 520 may include ninth to twelfth switches SW9 to SW12.

Functions of the blocks illustrated in FIG. 9 will be described below.

When a mode signal M is at a "low" level, the high voltage generator 510 may generate a positive high voltage by pumping a first input voltage (e.g., a supply voltage VDD) applied via a first input terminal IN1. When the mode signal M is at a "high" level, the high voltage generator 510 may generate a negative high voltage by pumping a second input voltage (e.g., a ground voltage VSS).

When the mode signal M is at the "low" level, the ninth switch SW9 may be turned on to transfer the first input voltage to the high voltage generator 510.

When the mode signal M is at the "high" level, the tenth switch SW10 may be turned on to transfer the negative high voltage output from the high voltage generator 510 to a second output terminal OUT2.

When the mode signal M is at the "low" level, the eleventh switch SW11 may be turned on to transfer the positive high voltage output from the high voltage generator 510 to the first output terminal OUT1.

When the mode signal M is at the "high" level, the twelfth switch SW12 may be turned on to transfer the second input voltage IN2 applied via the second input terminal IN2 to the high voltage generator 510.

That is, the high voltage generator 500 of FIG. 9 may output the positive high voltage via the first output terminal OUT1 by boosting the first input voltage IN1 when the mode signal M is at the "low" level and may output the negative high voltage via the second output terminal OUT2 by boosting down the second input voltage when the mode signal M is at the "high" level.

Figure 10:
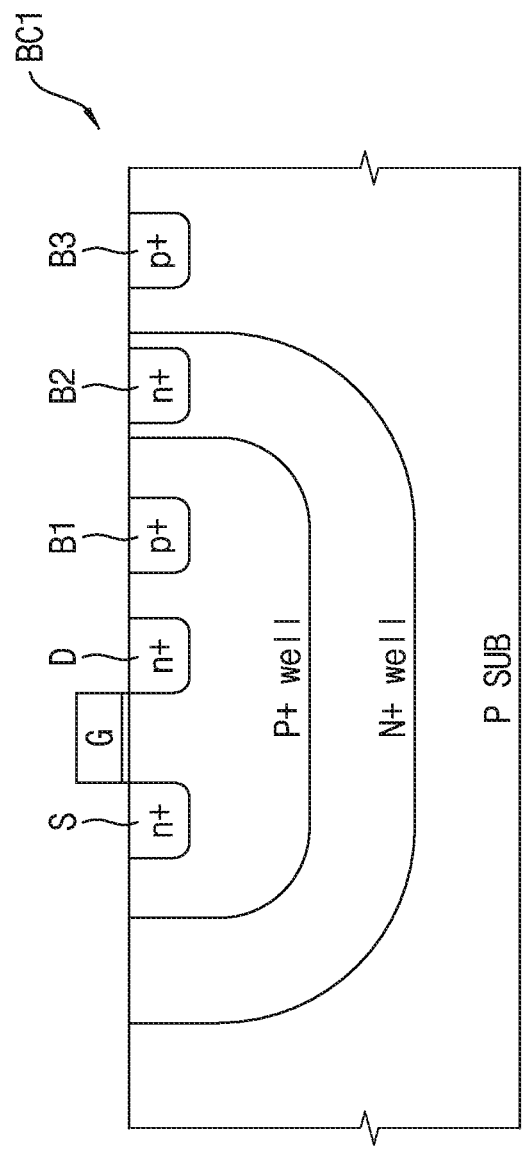
FIG. 10 is a cross-sectional view of a first body control transistor of a charge pump of a high voltage generator according to example embodiments.

FIG. 10 is a cross-sectional view of a first body control transistor of a charge pump of a high voltage generator according to example embodiments.

Referring to FIG. 10, a first body control transistor BC1 may be formed in a P+ well having a triple well structure including an N+ well formed in a P type substrate P SUB and a P+ well formed in the N+ well. The first body control transistor BC1 may include an n+ source S and an n+ drain D formed in the P+ well, a gate G formed on an upper portion of the P+ well between the n+ source S and the n+ drain D, and a p+ body B1. The p+ body B1 may be connected to a first body node, e.g., a fourth node n14 or a seventh node n17. An n+ body B2 formed in the N+ well may be connected to a terminal generating a highest voltage (e.g., an output terminal VOUT or an input terminal VIN). A ground voltage may be applied to a p+ body B3 formed in the P type substrate P SUB.

Although not shown, a first gate control transistor GC1, a first charge transfer transistor CT1, and a second body control transistor BC2 included in one boost-up pump or one boost-down pump, which is a charge pump, may be formed in a triple well structure, similar to the first body control transistor BC1. That is, NMOS transistors of each of boost-up pumps or boost-down pumps of a charge pump may be formed in a P+ well having the same triple well structure.

Although not shown, the first gate control transistor GC1, the first charge transfer transistor CT1, the first and second body control transistors BC1 and BC2, the second charge transfer transistor CT2, the second gate control transistor GC2, and the third and fourth body control transistors BC3 and BC4 may be embodied as p-type metal oxide semiconductor (PMOS) transistors. In this case, in the triple well structure of FIG. 10, the P type substrate, the N+ well, and the P+ well may be respectively replaced with an N type substrate, a P+ well, and an N+ well. The n+ source S, the n+ drain D, the p+ body B1 formed in the P+ well may be respectively replaced with a p+ drain, a p+ source, and an n+ body. The n+ body B2 formed in the N+ well may be replaced with a p+ body, and the p+ body B3 formed in the N type substrate may be replaced with an n+ body.

Figure 11:
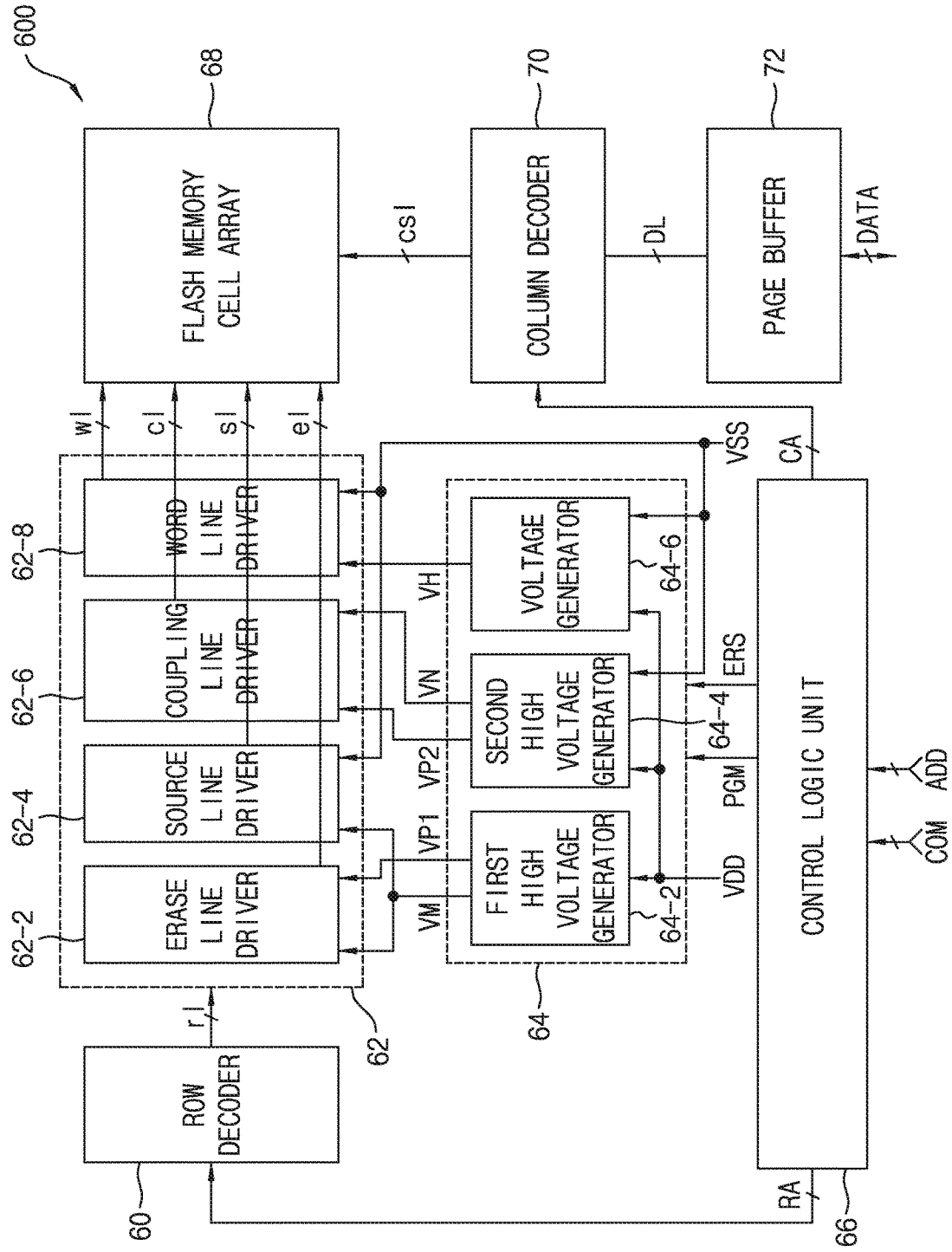
FIG. 11 is a block diagram illustrating a flash memory device according to example embodiments.

FIG. 11 is a block diagram illustrating a flash memory device according to example embodiments.

Referring to FIG. 11, a flash memory device 600 may include a row decoder 60, a row driver 62, a driving voltage generator 64, a control logic unit 66, a flash memory cell array 68, a column decoder 70, and a page buffer 72. The row driver 62 may include an erase line driver 62-2, a source line driver 62-4, a coupling line driver 62-6, and a word line driver 62-8. The driving voltage generator 64 may include a first high voltage generator 64-2, a second high voltage generator 64-4, and a voltage generator 64-6.

Functions of the blocks illustrated in FIG. 11 will be described below.

The row decoder 60 may decode a row address RA to generate row selection signals r1 for selecting row lines. Although not shown, the row lines may include word lines, coupling lines, source lines, and erase lines.

The erase line driver 62-2 may generate erase line selection signals e1, in response to the row selection signals r1.

The source line driver 62-4 may generate source line selection signals s1, in response to the row selection signals r1.

The coupling line driver 62-6 may generate coupling line selection signals c1, in response to the row selection signals r1.

The word line driver 62-8 may generate word line selection signals w1, in response to the row selection signals r1.

The first high voltage generator 64-2 may generate an intermediate high voltage VM by boosting a supply voltage VDD, in response to a program command PGM, and generate a first positive high voltage VP1 by boosting the supply voltage VDD, in response to an erase command ERS. The first high voltage generator 64-2 may be embodied as a high voltage generator as illustrated in FIG. 7. For example, the first high voltage generator 64-2 may generate the intermediate high voltage VM, which is 5 V, in response to the program command PGM (when the mode signal M illustrated in FIG. 7 is at a "low" level), and generate the first positive high voltage VP1, which is 10 V, in response to the erase command ERS (when the mode signal M of FIG. 7 is at a "high" level).

The second high voltage generator 64-4 may generate a second positive high voltage VP2 by boosting the supply voltage VDD, in response to the program command PGM, and generate a negative high voltage VN by boosting a ground voltage VSS, in response to the erase command ERS. The second high voltage generator 64-4 may generate the second positive high voltage VP2 in response to the program command PGM (when the mode signal M of FIG. 9 is at the "low" level), and generate the negative high voltage VN which is −8 V in response to the erase command ERS (when the mode signal M of FIG. 9 is at the "high" level).

The voltage generator 64-6 may receive the supply voltage VDD and generate a word line selection voltage VH, in response to the program command PGM, and may receive and generate the ground voltage VSS in response to the erase command ERS.

The control logic unit 66 may generate the program command PGM and the erase command ERS by decoding a command signal COM. Although not shown, the control logic unit 66 may further generate a read command by decoding the command signal COM. In addition, the control logic unit 66 may receive an address signal ADD and generate a row address RA and a column address CA.

The flash memory cell array 68 may program data in memory cells selected by the word line selection signals w1, the coupling line selection signals c1, the source line selection signals s1, the erase line selection signals e1, and column selection signals cs1, in response to the program command PGM, and may erase the data programmed in all the memory cells, in response to the erase command ERS.

The column decoder 70 may generate the column selection signals cs1 by decoding the column address CA.

The page buffer 72 may temporarily store data in response to the program command PGM, and transmit the data DATA to selected memory cells of the flash memory cell array 68 via data lines DL. In addition, the page buffer 72 may temporarily store data output from selected memory cells of the flash memory cell array 68 via the data lines DL, and output the data DATA, in response to a read command (not illustrated).

Figure 12:
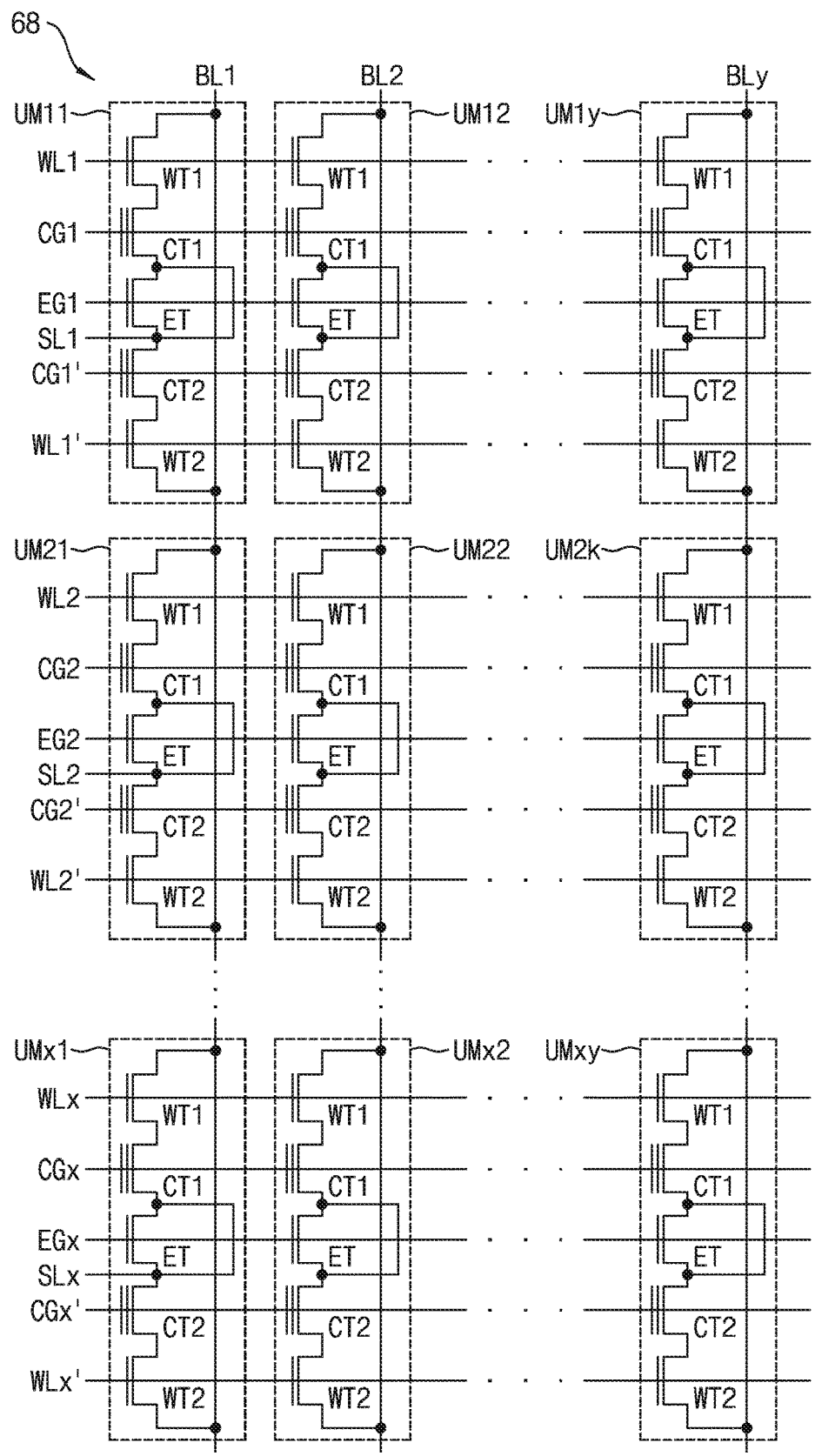
FIG. 12 is a circuit diagram illustrating a structure of a flash memory cell array illustrated in FIG. 11, according to example embodiments.

FIG. 12 is a circuit diagram illustrating a structure of the flash memory cell array 68 illustrated in FIG. 11, according to example embodiments. The flash memory cell array 68 may include (x×y) unit memory cells UM11 to UMxy arranged in the form of a matrix. Each of the unit memory cells UM11 to UMxy may include two memory cells.

Referring to FIG. 12, each of the unit memory cells UM11 to UMxy may include a first word gate transistor WT1, a first coupling gate transistor CT1, an erase gate transistor ET, a second coupling gate transistor CT2, and a second word gate transistor WT2. The first word gate transistor WT1 may include a gate connected to a corresponding word line WL1, WL2, . . . , or WLx and a drain connected to a corresponding bit line BL1, BL2, . . . , or BLy. The second word gate transistor WT2 may include a gate connected to a corresponding word line WL1', WL2', . . . , or WLx' and a drain connected to a corresponding bit line BL1, BL2, . . . , or BLy. The erase gate transistor ET may include a gate connected to a corresponding erase line EG1, EG2, . . . , or EGx and a source and a drain connected to a corresponding source line SL1, SL2, . . . , or SLx. The first coupling gate transistor CT1 may be a floating gate transistor connected between the corresponding first word gate transistor WT1 and a corresponding source line SL1, SL2, . . . , or SLx. The second coupling gate transistor CT2 may be a floating gate transistor connected between the corresponding second word gate transistor WT2 and a corresponding source line SL1, SL2, . . . , or SLx.

A program operation of the flash memory device will be described below with reference to FIGS. 11 and 12.

In response to row selection signals r1, the word line WL1, a coupling line CG1, the erase line EG1, and the source line SL1 may be selected. In this case, in response to a program command PGM, a word line selection voltage VH (e.g., 0.7 V) may be applied to the word line WL1, a second positive high voltage VP2 (e.g., 10 V) may be applied to the coupling line CL1, and an intermediate high voltage VM (e.g., 5 V) may be applied to the erase line EG1 and the source line SL1. In response to column selection signals cs1, j bit lines BL1 to BL16 (for example, j represents a number smaller than y and may be 16 (i.e., one word)) may be selected and a certain voltage (e.g., 0.3 V) may be applied via the bit lines BL1 to BL16. In this case, a certain voltage (e.g., 0 V) may be provided word lines, coupling lines, erase lines, and source lines which are not selected. In this case, a program operation may be performed in the floating gates of the first coupling gate transistors CT1 of the unit memory cells UM11 to UM16 through hot-carrier injection (HCI). That is, data (e.g., "0") may be programmed in the first coupling gate transistors CT1 of the unit memory cells UM11 to UM16.

An erase operation of the flash memory device will be described with reference to FIGS. 11 and 12 below.

A ground voltage (0 V) may be applied to the word lines WL1 to WLx and WL1' to WLx' and the source lines SL1 to SLx, a negative high voltage VN (e.g., −8 V) may be applied to the coupling lines CG1 to CGx and CG1' to CGx', and a first positive high voltage VP1 (e.g., 10 V) may be applied to the erase lines EG1 to EGx. The ground voltage (0 V) may be applied to the bit lines BL1 to BLy. In this case, electrons in the floating gates of the first coupling gate transistors CT1 and second coupling gate transistors CT2 of all the unit memory cells UM11 to UMxy may be lost due to Fowler-Nordheim tunneling. Thus, data of all the unit memory cells UM11 to UMxy may be erased. That is, data of the first and second coupling gate transistors CT1 and CT2 of all the unit memory cells UM11 to UMxy may be erased (i.e., data (e.g., "1") may be programmed therein).

As described above, for the program operation and the erase operation, in the flash memory device according to an embodiment of the inventive concept, the intermediate high voltage VM, the first and second positive high voltages VP1 and VP2, and the negative high voltage VN may be generated using the two first and second high voltage generators 64-2 and 64-4.

A first high voltage generator or a second high voltage generator according to an embodiment of the inventive concept as described above is applicable to other types of flash memory devices. The first high voltage generator or the second high voltage generator is also applicable to other devices or electronic devices in which different positive high voltages are used or a positive high voltage or a negative high voltage is used according to an operating mode, as well as a flash memory device.

According to the example embodiments of the inventive concept, a high voltage generator is capable of generating different positive (negative) high voltages or generating a positive high voltage or a negative high voltage according to a mode. In this case, a charge pump of the high voltage generator is capable of discharging charging charges of the gate of the charge transfer transistor after a boost-up operation or a boost-down operation, thereby precisely performing the boost-down operation after the boost-up operation or performing the boost-up operation after the boost-down operation.

According to the example embodiments of the inventive concept, a flash memory device is capable of generating either different positive high voltages or a positive high voltage and a negative high voltage by using one high voltage generator during a program operation and an erase operation, thereby simplifying a circuit structure.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A charge pump comprising:
   a first pumping capacitor configured to pump a first voltage of a first node, in response to a first clock signal;
   a gate pumping capacitor configured to pump a second voltage of a second node, in response to a second clock signal;
   a charge transfer transistor comprising a first source connected to a first one of a third node and the first node, a first gate connected to the second node, a first drain connected to a remaining one of the first node and the third node, and a first body connected to a fourth node;

a gate control transistor comprising a second source connected to the first one of the third node and the first node, a second gate connected to the remaining one of the first node and the third node, a second drain connected to the second node, and a second body connected to the fourth node;

a gate discharge or charge unit configured to discharge or charge a charge of the second node, and comprising at least one gate discharge or charge transistor comprising a third gate and a third source that are connected to the second node, a third drain connected to the remaining one of the first node and the third node, and a third body connected to the fourth node; and a first body control transistor comprising a fourth source connected to the first one of the third node or the first node, a fourth gate connected to the remaining one of the first node or the third node, and a fourth drain and a fourth body that are connected to the fourth node.

2. The charge pump of claim 1, further comprising a second body control transistor comprising a fifth source connected to the remaining one of the first node and the third node, a fifth gate connected to the first one of the third node or the first node, and a fifth drain and a fifth body that are connected to the fourth node.

3. The charge pump of claim 2, wherein each of the gate control transistor, the charge transfer transistor, the first body control transistor, the second body control transistor, and the at least one gate discharge or charge transistor has in a triple well structure.

4. The charge pump of claim 1, further comprising a second pumping capacitor configured to pump a third voltage of the third node, in response to a third clock signal, wherein, during a boost-up operation, a boost-up voltage higher than the third voltage of the third node or the first voltage of the first node is output to the remaining one of the first node and the third node, and wherein, during a boost-down operation, a boost-down voltage lower than the first voltage of the first node or the third voltage of the third node is output to the first one of the third node and the first node.

5. The charge pump of claim 4, wherein, during the boost-up operation:

in a first period, the second clock signal is at a high level when the first clock signal is at a low level; and in a second period, the first clock signal is at the high level when the second clock signal is at the low level, and wherein, during the boost-down operation:

in the first period, the second clock signal is at the high level when the third clock signal is at the high level; and in the second period, the second clock signal is at the low level when the third clock signal is at the low level.

6. A high voltage generator comprising:

a first predetermined number of boost-up or boost-down pumps configured to output, via a first output terminal, a positive or negative intermediate high voltage, by pumping an input voltage that is applied via an input terminal, the first predetermined number of boost-up or boost-down pumps being connected in series between the input terminal and the first output terminal; and a second predetermined number of boost-up or boost-down pumps configured to output, via a second output terminal, a positive or negative final high voltage, by pumping the positive or negative intermediate high voltage, the second predetermined number of boost-up or boost-down pumps being connected in series between the first output terminal and the second output terminal; and wherein each of the first predetermined number of boost-up or boost-down pumps and the second predetermined number of boost-up or boost-down pumps comprises:

a pumping capacitor configured to pump a first voltage of a first node, in response to a first clock signal or a third clock signal;

a gate pumping capacitor configured to pump a second voltage of a second node, in response to a second clock signal or a fourth clock signal;

a charge transfer transistor comprising a first source connected to a first one of a third node and the first node, a first gate connected to the second node, a first drain connected to a remaining one of the first node and the third node, and a first body connected to a fourth node;

a gate control transistor comprising a second source connected to the first one of the third node or the first node, a second gate connected to the remaining one of the first node or the third node, a second drain connected to the second node, and a second body connected to the fourth node;

a gate discharge or charge unit configured to discharge or charge a charge of the second node, and comprising at least one gate discharge or charge transistor comprising a third gate and a third source that are connected to the second node, a third drain connected to the remaining one of the first node and the third node, and a third body connected to the fourth node; and a first body control transistor comprising a fourth source connected to the first one of the third node or the first node, a fourth gate connected to the remaining one of the first node or the third node, and a fourth drain and a fourth body that are connected to the fourth node.

7. The high voltage generator of claim 6, wherein each of the first predetermined number of boost-up or boost-down pumps and the second predetermined number of boost-up or boost-down pumps further comprises a second body control transistor comprising a fifth source connected to the remaining one of the first node and the third node, a fifth gate connected to the first one of the third node or the first node, and a fifth drain and a fifth body that are connected to the fourth node.

8. The high voltage generator of claim 7, wherein the gate control transistor, the charge transfer transistor, the first body control transistor, the second body control transistor, and the at least one gate discharge or charge transistor included in each of the first predetermined number of boost-up or boost-down pumps and the second predetermined number of boost-up or boost-down pumps are formed in a triple well structure.

9. The high voltage generator of claim 6, wherein the pumping capacitor of each of odd-numbered boost-up or boost-down pumps among the first predetermined number of boost-up or boost-down pumps and the second predetermined number of boost-up or boost-down pumps is further configured to pump the first voltage of the first node, in response to the first clock signal, wherein the gate pumping capacitor of each of the odd-numbered boost-up or boost-down pumps is further configured to pump the second voltage of the second node, in response to the second clock signal, wherein the pumping capacitor of each of even-numbered boost-up or boost-down pumps among the first predetermined number of boost-up or boost-down pumps is further configured to pump the first voltage of the first node, in response to the third clock signal, and wherein the gate pumping capacitor of each of the odd-numbered boost-up or boost-down pumps is further configured to pump the second voltage of the second node, in response to the fourth clock signal.

10. The high voltage generator of claim 6, further comprising:

a clock generator configured to generate the first clock signal, the second clock signal, the third clock signal, and the fourth clock signal, in response to a first enable signal or a second enable signal during a first boost-up or boost-down operation or a second boost-up or boost-down operation;

a first regulator configured to generate a first divided voltage by dividing the positive or negative intermediate high voltage of the first output terminal, in response to a first regulator enable signal during the first boost-up or boost-down operation;

a first comparator configured to generate the first enable signal by comparing the first divided voltage with a first reference voltage;

a first high voltage discharge or charge unit configured to discharge or charge the positive or negative intermediate high voltage during a discharge or charge operation after the first boost-up or boost-down operation;

a second regulator configured to generate a second divided voltage by dividing the positive or negative final high voltage of the second output terminal, in response to a second regulator enable signal during the second boost-up or boost-down operation;

a second comparator configured to generate the second enable signal by comparing the second divided voltage with a second reference voltage; and a second high voltage discharge or charge unit configured to discharge or charge the positive or negative final high voltage during the discharge or charge operation after the second boost-up or boost-down operation.

11. A high voltage generator comprising:

a predetermined number of boost-up and boost-down pumps configured to:

output a positive high voltage via an output terminal, by boosting up an input voltage that is applied via an input terminal; and output a negative high voltage via the input terminal, by boosting down an output voltage that is applied via the output terminal, wherein the predetermined number of boost-up or boost-down pumps is connected in series between the input terminal and the output terminal, wherein each of the predetermined number of boost-up and boost-down pumps comprises:

a first pumping capacitor configured to pump a first voltage of a first node, in response to a first clock signal;

a second pumping capacitor configured to pump a third voltage of a third node, in response to a third clock signal;

a gate pumping capacitor configured to pump a second voltage of a second node, in response to a second clock signal or a fourth clock signal;

a charge transfer transistor comprising a first source connected to the third node, a first gate connected to the second node, and a first drain connected to the first node;

a gate control transistor comprising a second source connected to the third node, a second gate connected to the first node, and a second drain connected to the second node; and a gate discharge or charge unit configured to discharge or charge a charge of the second node;

a clock generator configured to generate the first dock signal, the second clock signal, the third clock signal, and the fourth clock signal, in response to a first enable signal during a boost-up operation;

a first regulator configured to generate a first divided voltage by dividing the positive high voltage of the output terminal, in response to a first regulator enable signal during the boost-up operation;

a first comparator configured to generate the first enable signal by comparing the first divided voltage with a first reference voltage; and a high voltage discharge unit configured to discharge the positive high voltage during a discharge operation after the boost-up operation.

12. The high voltage generator of claim 11, wherein the gate discharge or charge unit comprises at least one gate discharge or charge transistor comprising a third gate and a third source that are connected to the second node, and a third drain connected to the first node.

13. The high voltage generator of claim 12, wherein the charge transfer transistor comprises a first body connected to a fourth node, wherein the gate control transistor comprises a second body connected to the fourth node, wherein the at least one gate discharge or charge transistor comprises a third body connected to the fourth node, and wherein each of the predetermined number of boost-up and boost-down pumps further comprises:

a first body control transistor comprising a fourth source connected to the third node, a fourth gate connected to the first node, and a fourth drain and a fourth body that are connected to the fourth node; and a second body control transistor comprising a fifth source connected to the first node, a fifth gate connected to the third node, and a fifth drain and a fifth body that are connected to the fourth node.

14. The high voltage generator of claim 13, wherein the gate control transistor, the charge transfer transistor, the first body control transistor, the second body control transistor, and the at least one gate discharge or charge transistor included in each of the predetermined number of boost-up and boost-down pumps are formed in a triple well structure.

15. The high voltage generator of claim 11, wherein the first pumping capacitor of each of odd-numbered boost-up or boost-down pumps among the predetermined number of boost-up or boost-down pumps is further configured to pump the first voltage of the first node, in response to the first clock signal, wherein the gate pumping capacitor of each of the odd-numbered boost-up or boost-down pumps is further configured to pump the second voltage of the second node, in response to the second clock signal, wherein the first pumping capacitor of each of even-numbered boost-up or boost-down pumps among the predetermined number of boost-up or boost-down pumps is further configured to pump the first voltage of the first node, in response to the third clock signal, and wherein the gate pumping capacitor of each of the odd-numbered boost-up or boost-down pumps is further configured to pump the second voltage of the second node, in response to the fourth clock signal.

16. The high voltage generator of claim 11, wherein the clock generator is further configured to generate the first clock signal, the second clock signal, the third clock signal, and the fourth clock signal, in response to a second enable signal during a boost-down operation, and wherein the high voltage generator further comprises,
- a second regulator configured to generate a second divided voltage by dividing the negative high voltage of the input terminal, in response to a second regulator enable signal during the boost-down operation;
- a second comparator configured to generate the second enable signal by comparing the second divided voltage with a second reference voltage; and
- a high voltage charge unit configured to charge the negative high voltage during a charge operation after the boost-down operation.

* * * * *